US005635330A

United States Patent [19]
Coppens et al.

[11] Patent Number: 5,635,330
[45] Date of Patent: Jun. 3, 1997

[54] FINISHER AT 30°-60° C. IN METHOD FOR MAKING AN OFFSET PRINTING PLATE ACCORDING TO THE SILVER SALT DIFFUSION TRANSFER PROCESS

[75] Inventors: Paul Coppens, Turnhout; Ludovicus Vervloet, Kessel, both of Belgium

[73] Assignee: Agfa-Gevaert, N.V., Mortsel, Belgium

[21] Appl. No.: 401,890

[22] Filed: Mar. 10, 1995

[30] Foreign Application Priority Data

Apr. 8, 1994 [EP] European Pat. Off. .............. 94200954

[51] Int. Cl.$^6$ ................. G03C 8/32; G03F 7/07
[52] U.S. Cl. ............... 430/204; 430/248; 430/264; 430/302; 430/309; 101/466; 101/467
[58] Field of Search ..................... 430/204, 248, 430/309, 302, 264; 101/466, 467

[56] References Cited

U.S. PATENT DOCUMENTS

| | | | |
|---|---|---|---|
| 5,068,165 | 11/1991 | Coppens et al. | 430/204 |
| 5,445,914 | 8/1995 | Coppens et al. | 430/204 |
| 5,518,866 | 5/1996 | Coppens et al. | 430/204 |

*Primary Examiner*—Richard L. Schilling
*Attorney, Agent, or Firm*—Breiner & Breiner

[57] ABSTRACT

The present invention provides a method for making an offset printing plate according to the silver salt diffusion transfer process comprising the steps of exposing and developing an imaging element comprising in the order given on a hydrophilic surface of a support (i) an image receiving layer and (ii) a photosensitive layer comprising a photosensitive silver halide emulsion, removing the layer(s) on top of the image receiving layer thereby exposing the imaged surface of the support and treating said exposed imaged surface of the support with a finisher having a temperature between 30° C. and 60° C.

10 Claims, No Drawings

FINISHER AT 30°-60° C. IN METHOD FOR MAKING AN OFFSET PRINTING PLATE ACCORDING TO THE SILVER SALT DIFFUSION TRANSFER PROCESS

DESCRIPTION

1. Field of the Invention

The present invention relates to a method for making improved lithographic printing plates according to the silver salt diffusion transfer process.

2. Background of the Invention

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellent ink-receptive areas on a water-receptive ink-repellent background.

The DTR-image can be formed in the image receiving layer of a sheet or web material which is a separate element with respect to the photographic silver halide emulsion material (a so-called two-sheet DTR element) or in the image receiving layer of a so-called single-support-element, also called mono-sheet element, which contains at least one photographic silver halide emulsion layer integral with an image receiving layer in waterpermeable relationship therewith. It is the latter mono-sheet version which is preferred for the preparation of offset printing plates by the DTR method.

Two types of the mono-sheet DTR offset printing plate exist. According to a first type disclosed in e.g. U.S. Pat. No. 4,722,535 and GB-1,241,661 a support is provided in the order given with a silver halide emulsion layer and a layer containing physical development nuclei serving as the image-receiving layer. After information-wise exposure and development the imaged element is used as a printing plate without the removal of the emulsion layer.

According to a second type of mono-sheet DTR offset printing plate a hydrophilic support, mostly anodized aluminum, is provided in the order given with a layer of physical development nuclei and a silver halide emulsion layer. After information-wise exposure and development the imaged element is treated to remove the emulsion layer so that a support carrying a silver image is left wich is used as a printing plate. Such type of lithographic printing plate is disclosed e.g. in U.S. Pat. No. 3,511,656.

As for other printing plates it is required that the offset printing plates belonging to the second type of mono-sheet DTR offset printing plates have good printing properties: a high printing endurance, good ink acceptance in the printing areas, no ink acceptance in the non-printing areas (no toning) and a low number of copies that have to be disposed off because of ink acceptance in the non-printing areas (so called staining) during start-up of the printing process. Furthermore these printing properties should be preserved even after storing the printing plates for some time.

In order to improve the printing properties, it is common practice in the art to subject the imaged surface of the support to a chemical treatment that increases the hydrophilicity of the non-silver image parts and the oleophilicity of the silver image. This chemical after-treatment is preferably carried out with a lithographic composition often called finisher, which comprises at least one compound enhancing the ink-receptivity and/or lacquer-receptivity of the silver image, and also comprises at least one compound that improves the ink-repelling characteristics of the hydrophilic support as described in e.g. U.S. Pat. No. 5,068,165; EP-A 278,766 and 632,326.

However, even when using a finisher in the preparation of a lithographic printing plate of the second type, the results are not quite satisfactory. Furthermore in order that such a printing plate, even when treated with a finisher, should have good printing properties after storage for some time, the plate needs refinishing what is a cumbersome step and a loss of time for the printer.

SUMMARY OF THE INVENTION

It is an object of the present invention to provide a method for making offset printing plates according to the DTR-process having good printing properties i.a. a high printing endurance, good ink acceptance in the printing areas, no ink acceptance in the non-printing areas (no toning), a low number of copies that have to be disposed off because of ink acceptance in the non-printing areas (so called staining) during start-up of the printing process and preservation of these printing properties even after storing the printing plates for some time.

Further objects of the present invention will become clear from the description hereinafter.

According to the present invention there is provided a method for making an offset printing plate according to the silver salt diffusion transfer process comprising the steps of:

image-wise exposing an imaging element comprising in the order given on a hydrophilic surface of a support (i) an image receiving layer containing physical development nuclei and (ii) a photosensitive layer comprising a photosensitive silver halide emulsion said photosensitive layer being in water permeable relationship with said image receiving layer, applying an aqueous alkaline solution to the imaging element in the presence of (a) developing agent(s) and (a) silver halide solvent(s) to form a silver image in said image receiving layer, treating the imaging element to remove the layer(s) on top of the image receiving layer, thereby exposing the imaged surface of the support by uncovering said silver image formed in said image receiving layer, treating said exposed imaged surface of the support with a finisher to enhance the water-receptivity of the non-image areas and to make the image areas oleophilic ink-receptive, characterized in that the temperature of said finisher is comprised between 30° C. and 60° C.

DETAILED DESCRIPTION OF THE INVENTION

Lithographic printing plates are obtained according to the DTR-process having good printing properties and preserving them even after storing the printing plates for some time by treating the exposed imaged surface of the support with a finisher which has a temperature between 30° C. and 60° C., preferably between 40° and 50° C.

At the moment the treatment with the finisher is started the exposed imaged surface of the support may be in dry or in wet state. In general, the treatment with the finisher does not take long, usually not longer than about 30 seconds. A longer contact time probably does not impair the printing properties of the printing plate but is unadvisable for economical reasons. Preferably the time that the exposed imaged surface of the support is treated with the finisher is comprised between 2 and 25 seconds, more preferably between 3 and 20 seconds. It may be carried out immediately after the processing and uncovering steps or at a later stage, but before the plate is used for printing.

The finisher can be applied in different ways such as by rubbing with a roller, by wiping with an absorbent means e.g. with a plug of cotton or sponge, or by dipping the material to be treated in the finisher. Preferably, the finisher is applied automatically by conducting the printing plate through a device having a narrow channel filled with the finisher, usually conveying the printing plate at the end of the channel between two squeezing rollers removing the excess of liquid.

The imaging element is preferably prepared by coating the different layers on a hydrophilic layer of a support. Alternatively the different layers may be laminated to said image receiving layer from a temporary base holding the layers in reverse order as disclosed in U.S. Pat. No. 5,068,165.

The hydrophilic layer of a support can be a hardened hydrophilic layer, containing a hydrophilic synthetic homopolymer or copolymer and being hardened with a hydrolyzed tetraalkyl orthosilicate crosslinking agent coated on a flexible hydrophobic base. More preferably the hydrophilic layer is part of an aluminum support.

The aluminum support of the imaging element used according to the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results.

Graining of the aluminum surface can be carried out mechanically or electrolytically in any known way. The roughness produced by the graining is measured as a centre line average value expressed in µm and preferably varies from about 0.2 to about 1.5 µm.

The anodization of the aluminum foil can be performed in electrolytes such as e.g. chromic acid, oxalic acid, sodium carbonate, sodium hydroxide, and mixtures thereof. Preferably, the anodization of the aluminum is performed in dilute aqueous sulphuric acid medium until the desired thickness of the anodization layer is reached. The aluminum foil may be anodized on both sides. The thickness of the anodization layer is most accurately measured by making a micrographic cut but can be determined likewise by dissolving the anodized layer and weighing the plate before dissolution treatment and subsequent thereto. Good results are obtained with an anodization layer thickness of about 0.4 to about 2.00 µm.

After the anodizing step the anodic surface may be sealed. Sealing of the pores of the aluminum oxide layer formed by anodization is a technique known to those skilled in the art of aluminum anodization. The anodic surface of the aluminum foil can thus be rinsed with water at 70°–100° C. or with steam. The sealing can also be performed by treatment of the anodic surface with an aqueous solution comprising phosphate ions or silicates. Preferably the sealing is performed by means of an aqueous solution containing a bicarbonate as disclosed in EP-A 567,178. Thanks to the sealing treatment the anodic layer is rendered substantially non-porous so that longer press runs can be made with the printing plate obtained. As a result of the sealing the occurrence of fog in the non-printing areas of the printing plate is avoided substantially.

The graining, anodizing, and sealing of the aluminum foil can be performed as described in e.g. U.S. Pat. No. 3,861,917 and in the documents referred to therein.

To promote the image sharpness and, as a consequence thereof, the sharpness of the final printed copy, the anodization layer may be coloured in the mass with an antihalation dye or pigment e.g. as described in JA-Pu-58-14,797.

Subsequent to the preparation of the hydrophilic layer of a support as described above the hydrophilic layer of a support may be immediately coated with a solution containing the physical development nuclei or may be coated with said solution at a later stage.

The image receiving layer for use in accordance with the present invention is preferably free of hydrophilic binder but may comprise small amounts up to 30% by weight of the total weight of said layer of a hydrophilic colloid e.g. polyvinyl alcohol to improve the hydrophilicity of the layer.

Preferred development nuclei for use in accordance with the present invention are sulphides of heavy metals e.g. sulphides of antimony, bismuth, cadmium, cobalt, lead, nickel, palladium, platinum, silver, and zinc. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form. More preferred development nuclei for use in accordance with the present invention are nuclei, especially sulphides of heavy metals having an average diameter less than 6 nm and wherein the number of nuclei having a diameter larger than 4.5 nm is less than 15% of the total number of nuclei contained in said image receiving layer as disclosed in EP-A 546,598. Especially preferred development nuclei in connection with the present invention are palladium sulphide nuclei having an average diameter less than 6 nm and wherein the number of nuclei having a diameter larger than 4.5 nm is less than 15% of the total number of nuclei contained in said image receiving layer.

To promote the image sharpness the hydrophilic layer of a support can be provided with a very thin antihalation coating of a dye or pigment or the image receiving layer may incorporate at least one antihalation dye or pigment.

The photosensitive layer used in accordance with the present invention may be any layer comprising a hydrophilic colloid binder and at least one photosensitive silver halide emulsion, being in water permeable relationship with said image receiving layer.

Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or the complexed silver.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

For use according to the present invention the silver halide emulsion or emulsions preferably consist principally of silver chloride while a fraction of silver bromide may be present ranging from 1 mole % to 40 mole %. Most preferably a silver halide emulsion containing at least 70 mole % of silver chloride is used. The average size of the silver halide grains may range from 0.10 to 0.70 µm, preferably from 0.25 to 0.45 µm.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $0.5*10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-A-493,464 and 568,687, and polyamines such as diethylene triamine or derivatives of aminoethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. Koslowsky, Z. Wiss. Photogr. Photophys. Photochem. 46, 65–72 (1951).

The emulsions of the DTR element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,85, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

As binder in the silver halide emulsion layer(s) in connection with the present invention a hydrophilic colloid may be used, usually a protein, preferably gelatin. Gelatin can, however, be replaced in part by synthetic, semi-synthetic, or natural polymers. Preferably, the silver halide emulsion layer contains gelatin whereof a 10% by weight aqueous solution at 36° C. and pH 6 has a viscosity lower than 20 mPa.s at a shearing rate of 1000 $s^{-1}$, measured with a viscosimeter operating with a rotating cylinder and marketed under the tradename HAAKE ROTOVISCO rheometer Type M 10, wherein the cylinder can be rotated at 1000 rpm and a maximal shearing rate of 44,500 $s^{-1}$. Said low viscosity gelatin is preferably combined with a gelatin of a higher viscosity. The weight ratio of said low viscosity gelatin versus the gelatin of a higher viscosity is preferably more than 0.5.

Preferably the gelatin layer(s) is(are) substantially unhardened. Substantially unhardened means that when such gelatin layer is coated on a subbed polyethylene terephtalate film base at a dry thickness of 1.2 $g/m^2$, dried for 3 days at 57° C. and 35% R. H. and dipped in water of 30° C., said gelatin layer is dissolved for more than 95 % by weight within 5 minutes.

The silver halide emulsions may contain pH controlling ingredients. Preferably at least one gelatin containing layer is coated at a pH value not below the iso-electric point of the gelatin to avoid interactions between said gelatin containing coated layer and the hereafter mentioned intermediate layer. More preferably the gelatin layer contiguous to said intermediate layer is coated at a pH value not below the iso-electric point of the gelatin. Most preferably all the gelatin containing layers are coated at a pH value not below the iso-electric point of their gelatin. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,0787 and DE-P 2,453,217.

More details about the composition, preparation and coating of silver halide emulsions suitable for use in accordance with the present invention can be found in e.g. Product Licensing Index, Vol. 92, December 1971, publication 9232, p. 107–109.

Preferably, the imaging element also comprises an intermediate layer between the image receiving layer on the hydrophilic base and the photosensitive layer(packet) to facilate the removal of said layer(packet) thereby uncovering the silver image formed in the image receiving layer by processing the imaging element.

In one embodiment, the intermediate layer is a water-swellable intermediate layer coated at a ratio of 0.01 to 2.0 g/m2 and comprising at least one non-proteinic hydrophilic film-forming polymer e.g. polyvinyl alcohol and optionally comprising an antihalation dye or pigment as disclosed in EP-A-410500.

In another embodiment, the intermediate layer is a layer comprising hydrophobic polymer beads having an average diameter not lower than 0.2 μm and having been prepared by polymerization of at least one ethylenically unsaturated monomer. Preferably, said intermediate layer in dry condition comprises said hydrophobic polymer beads in an amount of up to 80% of its total weight. Further details are disclosed in EP-A-483415.

A supplemental intermediate layer, which may be present between said silver halide emulsion containing layer and said water-swellable intermediate layer or said intermediate layer comprising hydrophobic polymer beads may incorporate one or more ingredients such as i.a. antihalation dyes or pigment, developing agents, silver halide solvents, base precursors, and anticorrosion substances.

When the imaging element is prepared by laminating a layer packet comprising a photosensitive layer onto the image receiving layer the intermediate layer(s) are provided on the photosensitive layer(s), the water-swellable intermediate layer or the intermediate layer comprising hydrophobic polymer beads having an average diameter not lower than 0.2 μm and having been prepared by polymerization of at least one ethylenically unsaturated monomer being the upper layer.

According to the present invention the imaging element can be information-wise exposed in an apparatus according to its particular application. A wide choice of cameras for exposing the photosensitive silver halide emulsion exists on the market. Horizontal, vertical and darkroom type cameras and contact-exposure apparatus are available to suit any particular class of reprographic work. The imaging element in accordance with the present invention can also be exposed with the aid of i.a. laser recorders and cathode rays tubes.

The development and diffusion transfer of the information-wise exposed imaging element in order to form a silver image in said photosensitive layer and to allow unreduced silver halide or complexes formed thereof to diffuse image-wise from the photosensitive layer to said image receiving layer to produce therein a silver image, are effected with the aid of an aqueous alkaline solution in the presence of at least one developing agent and at least one silver halide solvent said alkaline solution preferably comprising a silver halide solvent.

The developing agent(s) and/or the silver halide solvent(s) can be incorporated in the aqueous alkaline solution and/or in the imaging element itself e.g. in at least one silver halide emulsion layer and/or in a water-swellable layer and/or in a supplemental hydrophilic colloid layer in water-permeable relationship with the silver halide emulsion layer(s).

The silver halide solvent can also be incorporated at least in part in the physical development nuclei containing layer. When the aqueous alkaline solution does not comprise the developing agent(s), it is merely an activating liquid that is capable of dissolving the developing agent(s) contained in one of the layers.

Suitable developing agents for use in accordance with the present invention are a hydroquinone-type compound in combination with a secondary developing agent of the class of 1-phenyl-3-pyrazolidinone compounds and p-N-methyl-aminophenol. Particularly useful 1-phenyl-3-pyrazolidinone developing agents are 1-phenyl-3-pyrazolidinone, 1-phenyl-4-methyl-3-pyrazolidinone, 1-phenyl-4-ethyl-5-methyl-3-pyrazolidinone, and 1-phenyl-4,4-dimethyl-3-pyrazolidinone.

The hydroquinone-type compound is e.g. hydroquinone, methyl-hydroquinone, or chlorohydroquinone. Preferred amounts of the hydroquinone-type developing agents are in the range of 0.05 mole to 0.25 mole per liter and preferred amounts of secondary developing agent(s) in the range of $1.8 \times 10^{-3}$ to $2.0 \times 10^{-2}$ mole per liter.

The silver halide solvent, which acts as a complexing agent for silver halide, preferably is a water-soluble thiosulphate or thiocyanate e.g. sodium, potassium, or ammonium thiosulphate or thiocyanate in an amount ranging from 5 g to 20 g per liter.

Further silver halide solvents that can be used in connection with the present invention are e.g. sulphite, amines, 2-mercaptobenzoic acid, cyclic imide compounds such as e.g. uracil, 5,5-dialkylhydantoins, alkyl sulfones and oxazolidones.

Further silver halide solvents for use in connection with the present invention are alkanolamines. Examples of alkanolamines that may be used in connection with the present invention correspond to the following formula:

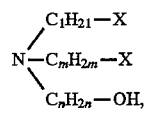

wherein X and X' independently represent hydrogen, a hydroxyl group or an amino group, l and m represent 0 or integers of 1 or more and n represents an integer of 1 or more. Said alkanolamines may be present in the alkaline processing liquid in a concentration preferably between 0.1% and 5% by weight. However part or all of the alkanolamine can be present in one or more layers of the imaging element.

Still other preferred further silver halide solvents for use in connection with the present invention are thioethers. Preferably used thioethers correspond to the following general formula:

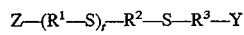

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain a oxygen bridge and t represents an integer from 0 to 10. Examples of thioether compounds corresponding to the above formula are disclosed in e.g. U.S. Pat. No. 4,960,683 and EP-A 554,585.

Still further suitable silver halide solvents are 1,2,4-triazolium-3-thiolates, preferably 1,2,4-triazolium-3-thiolates substituted with at least one substituent selected from the group consisting of a $C_1-C_8$ alkyl group that contains at least 3 fluorine atoms, a $C_4-C_{10}$ hydrocarbon group and a 4-amino group substituted with a $C_1-C_8$ alkyl group that contains at least 3 fluorine atoms and/or a $C_4-C_{10}$ hydrocarbon group.

Combinations of different silver halide solvents can be used and it is also possible to incorporate at least one silver halide solvent into a suitable layer of the imaging element and to add at least one other silver halide solvent to the developing solution.

The aqueous alkaline solution in accordance with the present invention may further comprise sulphite e.g. sodium sulphite in an amount ranging from 40 g to 180 g per liter, preferably from 60 to 160 g per liter in combination with another silver halide solvent.

The quantitative ranges given for the developing agents, silver halide solvents, and sulphite apply to the amount of these compounds present as solutes in the aqueous alkaline solution during the DTR-processing, whether these compounds make part of the aqueous alkaline solution or were dissolved from the layers containing them upon application thereto of the aqueous alkaline solution.

The aqueous alkaline solution suitable for use according to the present invention preferably comprises aluminum ions in an amount of at least 0.3 g/l, more preferably in an amount of at least 0.6 g/l in order to prevent sticking of the emulsion layer to the transporting rollers when the emulsion is swollen with the aqueous alkaline solution.

The alkaline processing liquid preferably has a pH between 9 and 14 and more preferably between 10 and 13, but depends on the type of silver halide emulsion material to be developed, intended development time, and processing temperature.

The processing conditions such as temperature and time may vary within broad ranges provided the mechanical strength of the materials to be processed is not adversely influenced and no decomposition takes place.

The pH of the alkaline processing liquid may be established by an organic or inorganic alkaline substance or a combination thereof. Suitable inorganic alkaline substances are e.g. hydroxides of sodium and potassium, alkali metal salts of phosphoric acid and/or silicic acid e.g. trisodium phosphate, orthosilicates, metasilicates, hydrodisilicates of sodium or potassium, and sodium carbonate etc. Suitable organic alkaline substances are e.g. alkanolamines. In the latter case the alkanolamines will provide or help providing the pH and serve as a silver halide complexing agent.

The aqueous alkaline solution may further comprise hydrophobizing agents for improving the hydrophobicity of the silver image obtained in the image image receiving layer. Generally these compounds contain a mercapto group or thiolate group and one or more hydrophobic substituents. Particularly preferred hydrophobizing agents are mercapto-1,3,4-thiadiazoles as described in DE-A 1,228,927 and in U.S. Pat. No. 4,563,410, 2-mercapto-5-heptyl-oxa-3,4-diazole and long chain (at least 5 carbon atoms) alkyl substituted mercaptotetrazoles. The hydrophobizing agents can be used alone or in combination with each other.

These hydrophobizing compounds can be added to the aqueous alkaline solution in an amount of preferably 0.1 to 3 g per liter and preferably in admixture with 1-phenyl-5-mercaptotetrazole, the latter compound may be used in amounts of e.g. 50 mg to 1.2 g per liter of solution, which may contain a minor amount of ethanol to improve the dissolution of said compounds.

The aqueous alkaline solution may comprise other ingredients such as e.g. oxidation preservatives, a compound releasing bromide ions, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not.

The development may be stopped—though this is often not necessary—with a so-called stabilization liquid, which actually is an acidic stop-bath having a pH preferably in the range of 5 to 6.

Buffered stop bath compositions comprising a mixture of sodium dihydrogen orthophosphate and disodium hydrogen orthophosphate and having a pH in said range are preferred.

The development and diffusion transfer can be initiated in different ways e.g. by rubbing with a roller, by wiping with an absorbent means e.g. with a plug of cotton or sponge, or by dipping the material to be treated in the liquid composition. Preferably, they proceed in an automatically operated apparatus. They are normally carried out at a temperature in the range of 18° C. to 30° C.

After formation of the silver image on the hydrophilic base an excess of alkaline solution still present on the base may be eliminated, preferably by guiding the foil through a pair of squeezing rollers.

The silver image thus obtained in the layer of physical development nuclei is subsequently uncovered by treating the imaging element to remove all the layers above the layer containing physical development nuclei, thereby exposing the imaged surface of the hydrophilic support.

According to a particularly preferred embodiment of the present invention the silver image in the layer of physical development nuclei is uncovered by washing off all the layers above the layer containing physical development nuclei with rinsing water.

The temperature of the rinsing water may be varied widely but is preferably between 30° C. and 50° C., more preferably between 35° C. and 45° C.

According to the present invention said exposed imaged surface of the hydrophilic support is treated with a finisher to enhance the water-receptivity of the non-image areas and to make the image areas oleophilic ink-receptive.

The lithographic composition often called finisher comprises at least one compound enhancing the ink-receptivity and/or lacquer-receptivity of the silver image and at least one compound that improves the ink-repelling characteristics of the hydrophilic surface.

Suitable ingredients for the finisher are e.g. organic compounds containing a mercapto group such as the hydrophobizing compounds referred to hereinbefore for the alkaline solution. Preferred compounds correspond to one of the following formulas:

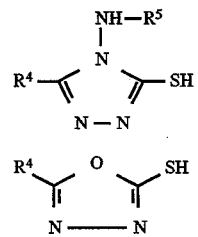

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms. Said (a) hydrophobizing agent(s) is(are) comprised in the finisher preferably in a total concentration between 0.1 g/l and 10 g/l, more preferably in a total concentration between 0.3 g/l and 3 g/l.

Additives improving the oleophilic ink-repellency of the hydrophilic surface areas are e.g. carbohydrates such as acid polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, and polyvinyl alcohol. Optionally, hygroscopic substances e.g. sorbitol, glycerol, tri(hydroxyethyl)ester of glycerol, and turkey red oil may be added.

Said additives are preferably polyglycols, being the reaction products of ethyleneoxide and/or propyleneoxide with water or an alcohol. Said polyglycols preferably comprise at least 50% by weight, more preferably at least 80% by weight, most preferably at least 95% by weight of ethyleneoxide groups and/or propyleneoxide groups. The total sum of ethyleneoxide groups and/or propyleneoxide groups is preferably at least 7. When said polyglycols comprise ethyleneoxide groups and propyleneoxide groups, the number ratio between these groups is preferably at least 1, more preferably at least 2, still more preferably at least 3. Preferably the total sum of ethyleneoxide groups and propyleneoxide groups in such polyglycols is comprised between 20 and 600, more preferably between 100 and 450. Particularly preferred polyglycols are polyethyleneglycols wherein the number of ethyleneoxide groups is comprised between 9 and 350, more preferably between 20 and 250, most preferably between 30 and 100. Preferably said polyglycols are present in the finisher in a total amount between 20 g/l and 300 g/l, more preferably between 50 g/l and 150 g/l.

Furthermore (a) surface-active compound(s) is preferably also added to the finisher. The concentration thereof may vary within broad ranges provided the finisher shows no excessive degree of foaming when plates are finished. Preferably (a) surface-active compound(s) is(are) present in the finisher in an amount between 10 mg/l and 10 g/l, more preferably in an amount between 50 mg/l and 5 g/l, most preferably in an amount between 100 mg/l and 2.5 g/l. Preferred surface-active compound are anionic or non-ionic surface-active compound.

As soon as the hydrophilic surface of the support carrying the silver image has been treated with the finisher, it is ready to be used as a printing plate.

EXAMPLE 1 (COMPARATIVE EXAMPLE)

A 0.30 mm thick aluminum foil (AA 1050) was degreased by immersing the foil in an aqueous solution containing 10% phosphoric acid and subsequently etched in an aqueous solution containing 2 g/l of sodium hydroxide. The foil was then electrochemically grained using an alternating current in an aqueous solution containing 4 g/l of hydrochloric acid and 4 g/l of hydrobcric acid at a temperature of 35° C. to form a surface topography with an average center-line roughness Ra of 0.6 µm. The aluminum plate was then desmutted with an aqueous solution containing 30% of sulfuric acid at 60° C. for 120 seconds. The foil was subsequently subjected to anodic oxidation in a 20% sulfuric acid aqueous solution to form an anodic oxidation film of 3.0 g/m$^2$ of $Al_2O_3$. $H_2O$, treated with an aqueous solution containing 20 g/l of $NaHCO_3$ at 45° C. for 30 sec and then rinsed with demineralised water and dried.

The imaging element was obtained by coating the grained, anodized and sealed aluminum support with a silver-receptive stratum containing 1.1 mg/m$^2$ PdS as physical development nuclei.

An intermediate layer was then provided on the dry silver-receptive stratum from an aqueous composition in such a way that the resulting dried layer had a weight of 0.5 g of polymethyl methacrylate beads per m$^2$, said composition comprising:

| | |
|---|---|
| a 20% dispersion of polymethyl methacrylate beads in a mixture of equal volumes of water and ethanol having an average diameter of 1.0 µm | 50 ml |
| Helioechtpapierrot BL (trade mark for a dye sold by BAYER AG, D-5090 Leverkusen, West-Germany) | 2.5 g |
| saponine | 2.5 g |
| sodium oleylmethyltauride | 1.25 g |
| demineralized water (pH-value:5.6) | 300 ml |

Finally a substantially unhardened photosensitive negative-working cadmium-free gelatin silver chlorobromoiodide emulsion layer (97.98/2/0.02 mol %) containing 1 mmole/mole AgX of 4-hydroxy-6-methyl-1,3,3a,7-tetraazaindene was coated on the intermediate layer, the silver halide being provided in an amount corresponding to 2.40 g of silver nitrate per m$^2$ and the gelatin content of the emulsion layer being 1.58 g/m$^2$, consisting of 0.7 g/m$^2$ of a gelatin with a viscosity of 21 mPa.s and the remainder of a gelatin with a viscosity of 14 mPa.s The imaging element was exposed through a contact screen in a process-camera and immersed for 10 s at 20° C. in a freshly made developing solution having the following ingredients:

| | |
|---|---|
| carboxymethylcellulose | 4 g |
| sodium hydroxide | 22.5 g |
| anhydrous sodium sulphite | 120 g |
| hydroquinone | 20 g |
| 1-phenyl-3-pyrazolidinone | 6 g |
| potassium bromide | 0.75 g |
| anhydrous sodium thiosulphate | 8 g |
| ethylene diamine tetraacetic acid tetrasodium salt | 2 g |
| demineralized water to make | 1000 ml |
| pH (24° C.) = 13 | |

The initiated diffusion transfer was allowed to continue for 30 s to form a silver image in the image receiving layer.

To remove the developed silver halide emulsion layer and the intermediate layer from the aluminum foil the developed monosheet DTR material was rinsed for 6 s with a water jet at 40° C.

Next, the imaged surface of the aluminum foil was guided for 15 s through a finisher having a temperature of 25° C., respectively 40° C., to enhance the water-receptivity of the non-image areas and to make the image areas oleophilic ink-receptive. In this way, two sets of three identical printing plates were prepared. The finisher had the following composition:

| | |
|---|---|
| AKYPO-OP-80 (trade mark for a surfactant sold by Chemische Fabrik Chem-Y, Gmbh. Germany) | 250 mg |
| polyethyleenoxide 3000 | 100.0 g |
| $NaH_2PO_4.2H_2O$ | 20.0 g |
| potassium nitrate | 12.5 g |
| citric acid | 20.0 g |
| 1-phenyl-5-mercaptotetrazole | 2.0 g |
| sodium hydroxide | 5.5 g |
| water to make | 1000 ml |
| pH (20° C.) = 6 | |

Of each set, one freshly prepared plate was used for printing. The other two plates of each set were stored together in an identical way in a room at 20° C. and 85% relative humidity. Of each set of stored plates, one plate was used as such for printing while the other one was guided again for 15 s through the above described finisher having a temperature of 25° C., respectively 40° C.

The printing plates of each set, treated in a identical way, were mounted beside each other on the same offset printing machine (HEIDELBERG GTO-46) and were used for printing under identical conditions. A mixture of AQUA TAME 7035E at a 3% concentration and AQUA AYDE 7022A at a 4% concentration, both marketed by Anchor/Lithemko Inc., Florida, USA was used in an aqueous solution containing 10% isopropanol as dampening solution and K+E 171, marketed by Kast+Ehinger, A. G., Germany was used as ink. A compressible rubber blanket was used.

The ink acceptance, the printing quality and the preservation of the printing properties of the plates, obtained as described above were evaluated as follows:

Ink acc.: number of copies that has to be printed before a constant ink acceptance in the printing areas is obtained Prin. qual.: this value relates to the presence of white spots in the printed areas of the 25th copy and is visually evaluated on a relative scale from 0 to 5, where 0 stands for a total absence of white spots in the printed areas and where 5 indicates a very high number of white spots in the printed areas.

The results are given in table 1.

TABLE 1

| No | Finisher | Storing | Refinish | Ink acc. | Print qual. |
|----|----------|---------|----------|----------|-------------|
| 1  | 25° C.   | no      | no       | 20       | 1–2         |
| 2  | 40° C.   | no      | no       | 5        | 0           |
| 3  | 25° C.   | yes     | no       | 50       | 1–2         |
| 4  | 40° C.   | yes     | no       | 10       | 0–1         |
| 5  | 25° C.   | yes     | yes      | 25       | 1–2         |
| 6  | 40° C.   | yes     | yes      | 10       | 0           |

Evaluation:

From these results it is seen that by using a finisher having a temperature of 25° C., the ink acceptance and the printing quality of the so obtained printing plates is clearly inferior to the ink acceptance and the printing quality of the printing plates obtained by using a finisher having a temperature of 40° C. This is so for the freshly used plates and for the plates stored at 20° C. and 85% relative humidity and refinished. For the plates stored at 20° C. and 85% relative humidity and not refinished, it is even more distinct; the ink acceptance of the printing plate obtained by using a finisher having a temperature of 25° C. becoming unacceptable while the ink acceptance of the printing plate obtained by using a finisher having a temperature of 40° C. is still very good.

We claim:

1. A method for making an offset printing plate according to the silver salt diffusion transfer process comprising the steps of:

image-wise exposing an imaging element comprising in the order given on a hydrophilic surface of a support (i) an image receiving layer containing physical development nuclei and (ii) a photosensitive layer comprising a photosensitive silver halide emulsion said photosensitive layer being in water permeable relationship with said image receiving layer, applying an aqueous alkaline solution to the imaging element in the presence of (a) developing agent(s) and (a) silver halide solvent(s) to form a silver image in said image receiving layer.

treating the imaging element to remove the layer(s) on top of the image receiving layer, thereby exposing the imaged surface of the support by uncovering said silver image formed in said image receiving layer, treating said exposed imaged surface of the support with a finisher to enhance the water-receptivity of the non-image areas and to make the image areas oleophilic ink-receptive, characterized in that the temperature of said finisher is comprised between 30° C. and 60° C.

2. A method according to claim 1 wherein the temperature of said finisher is comprised between 40° C. and 50 ° C.

3. A method according to claim 1 or 2 wherein the time that the exposed imaged surface of the support is treated with the finisher is comprised between 2 and 25 seconds.

4. A method according to claim 1 or 2 wherein the time that the exposed imaged surface of the support is treated with the finisher is comprised between 3 and 20 seconds.

5. A method according to any of claims 1 to 4 wherein the finisher is applied automatically by conducting the printing plate through a device having a narrow channel filled with the finisher.

6. A method according to any of claims 1 to 5 wherein the finisher contains (a) polyglycol(s) comprising at least 50% by weight ethyleneoxide groups and/or propyleneoxide groups.

7. A method according to claim 6 wherein said polyglycol (s) is(are) (a) polyethyleneglycol(s) wherein the number of ethyleneoxide groups is(are) comprised between 20 and 250 and is (are) present in the finisher in a total amount between 20 g/l and 300 g/l.

8. A method according to any of claims 1 to 7 wherein the finisher contains (a) mercapto-1,3,4-thiadiazole(s), (a) mercapto-5-heptyl-oxa-3,4-diazole(s) and/or (a) long chain (at least 5 carbon atoms) alkyl substituted mercaptotetrazole (s) in a total concentration between 0.1 g/l and 10 g/l.

9. A method according to any of claims 1 to 8 wherein the finisher contains (a) surface-active compound(s) in an amount between 10 mg/l and 10 g/l.

10. A method according to any of claims 1 to 9 wherein all the layers above the layer containing physical development nuclei are removed by washing the imaging element with rinsing water, having a temperature between 30° C. and 50° C.

* * * * *